(12) United States Patent
Kim

(10) Patent No.: US 7,341,885 B2
(45) Date of Patent: Mar. 11, 2008

(54) CMOS IMAGE SENSOR AND METHOD FOR FABRICATING THE SAME

(75) Inventor: Seoung Hyun Kim, Pocheon (KR)

(73) Assignee: Dongbu Electronics Co., Ltd, Seoul (KR)

( * ) Notice: Subject to any disclaimer, the term of this patent is extended or adjusted under 35 U.S.C. 154(b) by 128 days.

(21) Appl. No.: 11/319,184

(22) Filed: Dec. 28, 2005

(65) Prior Publication Data

US 2006/0138500 A1    Jun. 29, 2006

(30) Foreign Application Priority Data

Dec. 29, 2004    (KR) .................. 10-2004-0114658

(51) Int. Cl.
   *H01L 21/00*    (2006.01)
(52) U.S. Cl. .............. 438/69; 438/65; 438/70; 257/433; 257/434
(58) Field of Classification Search .......... 438/65, 438/69, 70; 257/431, 432, 433, 434
   See application file for complete search history.

(56) References Cited

U.S. PATENT DOCUMENTS

| | | | |
|---|---|---|---|
| 6,297,071 B1* | 10/2001 | Wake | 438/70 |
| 6,586,811 B2* | 7/2003 | Sekine | 257/432 |
| 6,590,239 B2* | 7/2003 | Hsiung et al. | 257/233 |
| 6,933,167 B2* | 8/2005 | Yamamoto | 438/69 |
| 7,180,044 B2* | 2/2007 | Yu | 250/208.1 |
| 2004/0147059 A1* | 7/2004 | Jeong et al. | 438/70 |
| 2004/0159774 A1* | 8/2004 | Mishina et al. | 250/208.1 |
| 2004/0238908 A1* | 12/2004 | Hashimoto | 257/432 |
| 2005/0048690 A1* | 3/2005 | Yamamoto | 438/69 |
| 2005/0141104 A1* | 6/2005 | Hong | 359/727 |

FOREIGN PATENT DOCUMENTS

KR    10-2002-0034311 A    5/2002

* cited by examiner

*Primary Examiner*—Fernando L. Toledo
(74) *Attorney, Agent, or Firm*—McKenna Long & Aldridge LLP

(57) ABSTRACT

A CMOS image sensor and method for fabricating the same improve image characteristics by eliminating the thickness of a planarization layer. The CMOS image sensor includes a semiconductor substrate; a plurality of active devices, provided in a predetermined surface of the semiconductor substrate, for generating electrical charges according to an amount of incident light; an insulating interlayer formed on an entire surface of the semiconductor substrate including the plurality of active devices; a color filter layer formed on the insulating interlayer, the color filter layer comprised of red, green, and blue color filter patterns for respectively filtering light according to wavelength, the color filter patterns arranged to correspond to the plurality of active devices; and a plurality of microlenses formed on the color filter layer, wherein the color filter layer is planarized so that each color filter pattern of the color filter layer is imparted with an equal height for receiving the plurality of microlenses.

15 Claims, 8 Drawing Sheets

CMOS IMAGE SENSOR AND METHOD FOR FABRICATING THE SAME

CROSS-REFERENCE TO RELATED APPLICATIONS

This application claims the benefit of Korean Patent Application No. 10-2004-0114658 filed on Dec. 29, 2004, which is hereby incorporated by reference for all purposes as if fully set forth herein.

BACKGROUND OF THE INVENTION

1. Field of the Invention

The present invention relates to an image sensor, and more particularly, to a CMOS image sensor and a method for fabricating the same, which improves the sensor's image characteristics.

2. Discussion of the Related Art

Image sensors are semiconductor devices for converting an optical image into an electrical signal and include charge-coupled devices and complementary metal-oxide-semiconductor (CMOS) image sensors. A general charge-coupled device includes an array of photodiodes converting light signals into electrical signals. Disadvantages of a charge-coupled device include a complicated driving method, high power consumption, and a complicated fabrication process requiring a multi-phased photo process. In a charge-coupled device, integration of complementary circuitry such as a control circuit, a signal processor, and an analog-to-digital converter into a single-chip device is difficult. Thus, development of compact-sized or thin products using such image sensors is hindered. Examples of compact-sized or thin products include digital still cameras and digital video cameras.

CMOS image sensors, on the other hand, adopt CMOS technology using a control circuit and a signal processing circuit as a peripheral circuit. CMOS image sensors also adopt switching technology which allows outputs to be sequentially detected using MOS transistors corresponding to a number of arrayed pixels. This allows an image to be detected. Accordingly, a CMOS image sensor uses CMOS fabrication technology, i.e., a simple fabrication method using fewer photolithography steps, thereby enabling an advantageous device exhibiting low power consumption.

In the aforementioned CMOS image sensor of the related art, the photodiode is the active device for forming an optical image based on incident light signals. The optical image is formed by generating electrical signals according to the intensity and wavelength or color of incident light. In such a CMOS image sensor, each photodiode senses incident light and the corresponding CMOS logic circuit converts the sensed light into an electrical signal according to input wavelength. The photosensitivity of the photodiode increases as more light is able to reach the photodiode. In this instance, enhanced photosensitivity results from an increase in the levels of sensed light and corresponds to the light-receiving capability of the active device. One way of enhancing the photosensitivity of a CMOS image sensor is to improve its "fill factor," i.e., the degree of surface area covered by the photodiodes versus the entire surface area of the image sensor. The fill factor is improved by increasing the area responsive to incident light, i.e., the photo-sensing portion. However, there is a limit to increasing the photo-sensing portion due to the required presence of the logic circuit portion.

Therefore, a device of a material exhibiting excellent light transmittance, such as a convex microlens having a predetermined curvature for refracting incident light, may be provided to redirect any light that may be incident on the image sensor outside the immediate area of the photodiodes. The device may also be provided to concentrate or focus the incident light on one or more of the photodiodes themselves. That is, the incident light, striking the surface of the convex structure of the microlens while in parallel to the optical axis of the microlens, is refracted by the microlens according to the curvature of the convex structure. The incident light is thereby focused at a predetermined point along the optical axis. Accordingly, in a color image sensor, such a microlens may be provided over a color filter layer including red (R), blue (B), and green (G) filter elements for passing the light of each color or wavelength to be disposed over a photodiode area.

Meanwhile, CMOS image sensors are classified according to a number of transistors. For example, a 3T-type CMOS image sensor consists of one photodiode and three transistors and a 4T-type CMOS image sensor consists of one photodiode and four transistors. An equivalent circuit and layout of a unit pixel of a 3T-type CMOS image sensor of the related art are shown in FIG. 1 and FIG. 2, respectively.

Referring to FIG. 1, a CMOS image sensor of the related art comprises one photodiode PD and three NMOS transistors including a reset transistor Rx, a drive transistor Dx, and a select transistor Sx. The cathode of the photodiode PD is commonly connected to the drain of the reset transistor Rx and the gate of the drive transistor Dx, whose drain is connected to the source of the select transistor Sx, whose drain is in turn connected to a read circuit. With the anode of the photodiode PD grounded, a reference voltage $V_R$ is applied via a power line to the source of each of the reset and drive transistors Rx and Dx. A reset signal RST is applied via a reset line to the gate of the reset transistor Rx and a select signal SLCT is applied via a column select line to the gate of the select transistor Sx.

Referring to FIG. 2, an active area 100 is defined for each unit pixel of the CMOS image sensor of FIG. 1. The active area 100 includes a photodiode area 20 comprising the bulk of the active area, which is overlapped by gate electrode areas 120, 130, and 140 of the three NMOS transistors, respectively. The source/drain region of each transistor is formed by an ion-implantation process with respect to the active area 100. Power (Vdd) is applied to the source/drain regions of the reset transistor Rx and drive transistor Dx. The source/drain region of the select transistor Sx is connected to the read circuit. Each of the gate electrodes 120, 130, and 140 is connected to external circuitry (not shown) via a corresponding signal line having a pad provided at one end.

As shown in FIG. 3, a CMOS image sensor of the related art includes a plurality of photodiodes 11 formed in a surface of a semiconductor substrate 10, an insulating interlayer 12 formed on the entire surface of the semiconductor substrate 10 including the photodiodes 11, a first planarization layer (not shown) formed on the insulating interlayer 12, a color filter layer 14 formed on the first planarization layer, a second planarization layer 15 formed on the entire surface of the semiconductor substrate 10 including the color filter layer 14, and a plurality of microlenses 16 provided on the second planarization layer 15 corresponding to the respective photodiodes 11, each microlens being formed as convex structure and having a predetermined curvature. The microlenses 16 focus incident light onto the corresponding photodiodes 11 through the color filter layer 14. The color filter layer 14 is comprised of red (R), green (G), and blue (B) color filter patterns for respectively filtering light according to wavelength. Each of the photodiodes 11 is disposed below one of the color filter patterns and generates an electrical charge according to the amount of incident light that reaches the photodiode.

The curvature and height of the microlens, which is a critical component of an image sensor, are determined in due consideration of the desired focus of incident light. Generally, the microlens is made of polymer-based resin enabling a completed microlens to be formed using only a photolithography patterning process of exposure and development followed by a reflowing process. The pattern profile or shape of the microlens tends to vary according to exposure conditions, for example, the conditions of a thin film on the semiconductor substrate, which are rather unstable. This results in degraded focusing characteristics. The microlens is nevertheless formed to have the optimal size, thickness, and curvature radius, which are determined with due regard to such parameters as shape, size, and positioning of a unit pixel, photodiode thickness, and physical characteristics (e.g., dimensions) of a light-shielding layer.

Meanwhile, the respective color filter patterns have different heights since each is formed by its own individual photolithography processing. Therefore, the planarization layer 15 provides a level surface, above the upper surfaces of the color filter patterns, for receiving the microlens array. Accordingly, as shown in FIG. 3, the traveling distance a of light, which passes through the microlens 16 to be incident on the photodiode 11, is inherently increased due to the thickness of the planarization layer 15. Since the light-receiving efficiency of the CMOS image sensor of the related art depends on the amount of light reaching the photodiode, light sensitivity is lowered due to the greater traveling distance, thereby deteriorating the capacity of the CMOS image sensor.

SUMMARY OF THE INVENTION

Accordingly, the present invention is directed to a CMOS image sensor and a method for fabricating the same that substantially obviates one or more problems due to limitations and disadvantages of the related art.

An advantage of the present invention is to provide a CMOS image sensor and a method for fabricating the same that improves image characteristics by eliminating the thickness of a planarization layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a CMOS image sensor comprising a semiconductor substrate; a plurality of active devices, provided in a predetermined surface of the semiconductor substrate, for generating electrical charges according to an amount of incident light; an insulating interlayer formed on an entire surface of the semiconductor substrate including the plurality of active devices; a color filter layer formed on the insulating interlayer, the color filter layer comprised of red, green, and blue color filter patterns for respectively filtering light according to wavelength, the color filter patterns arranged to correspond to the plurality of active devices; and a plurality of microlenses formed on the color filter layer, wherein the color filter layer is planarized so that each color filter pattern of the color filter layer is imparted with an equal height for receiving the plurality of microlenses.

In another aspect of the present invention, there is provided a method for fabricating a CMOS image sensor. The method comprises forming a plurality of photodiodes in a predetermined surface of a semiconductor substrate; forming an insulating interlayer on an entire surface of the semiconductor substrate including the plurality of photodiodes; forming a color filter layer including red, green, and blue color filter patterns on the insulating interlayer; planarizing the color filter layer so that each color filter pattern of the color filter layer is imparted with an equal height; and forming a plurality of microlenses on the planarized color filter layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

Figure 1:
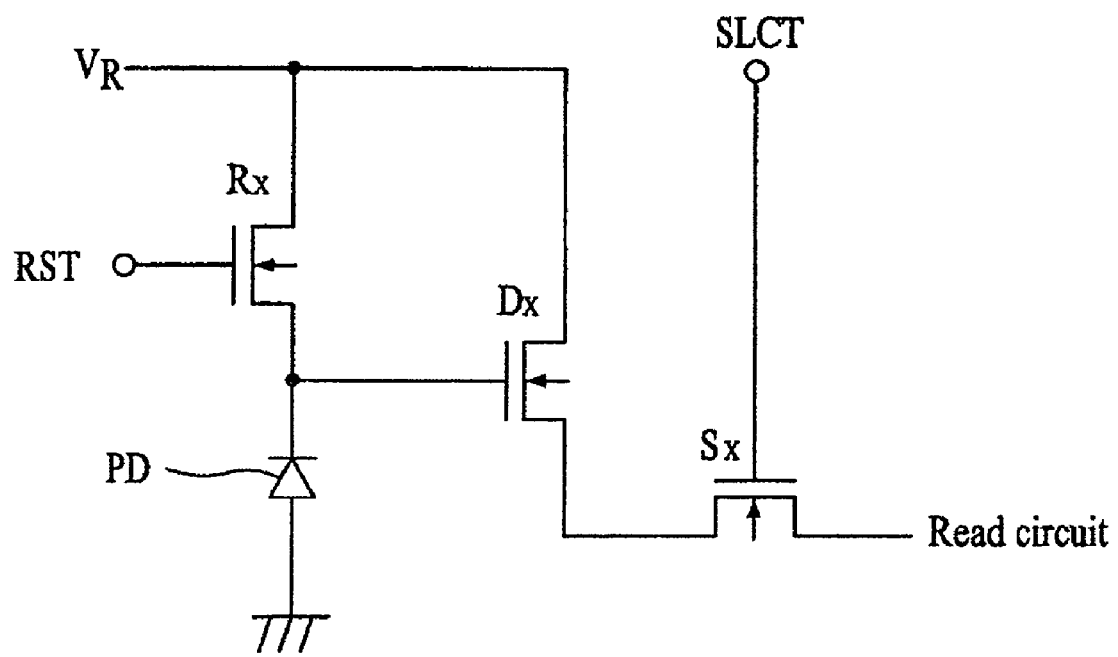
FIG. 1 is an equivalent circuit view of a 3T-type CMOS image sensor of the related art.
Figure 2:
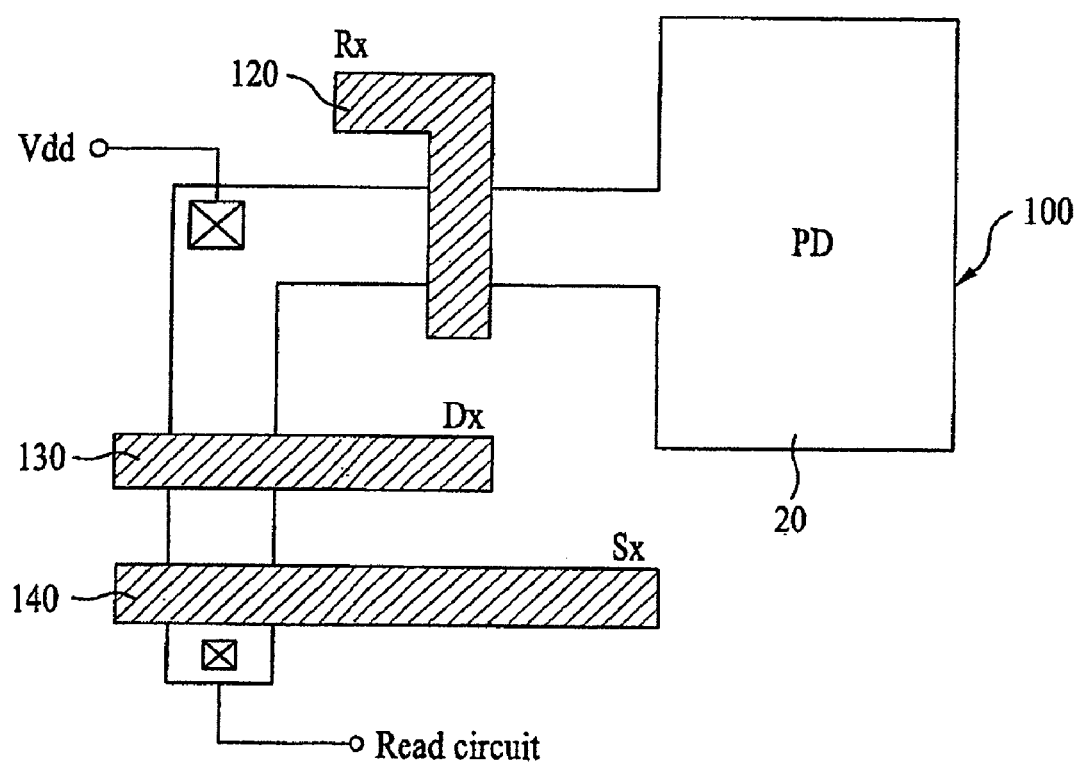
FIG. 2 is a layout of a unit pixel in a 3T-type CMOS image sensor of the related art.
Figure 3:
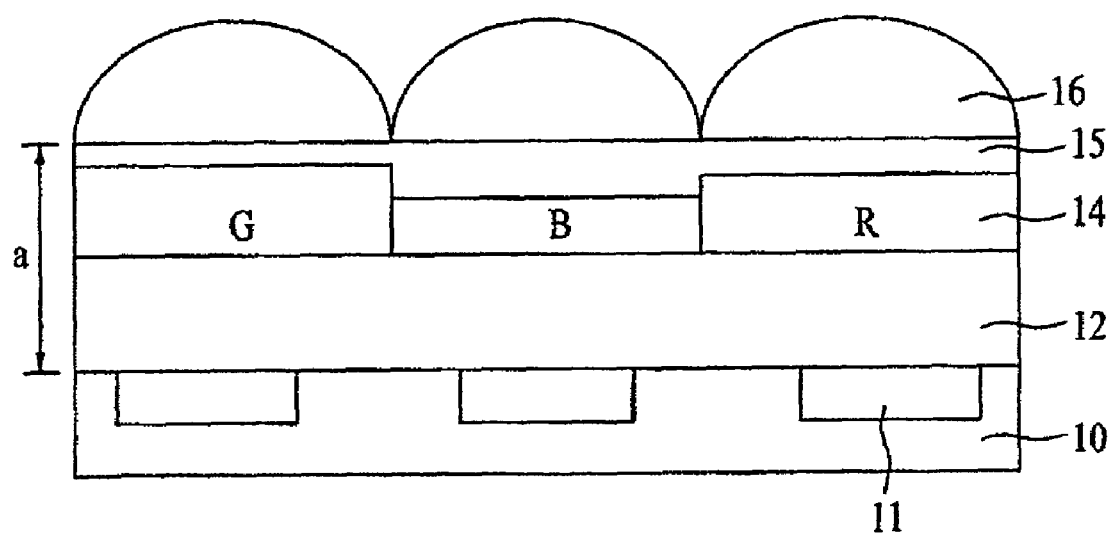
FIG. 3 is a cross-sectional view of a CMOS image sensor of the related art.
Figure 4A:
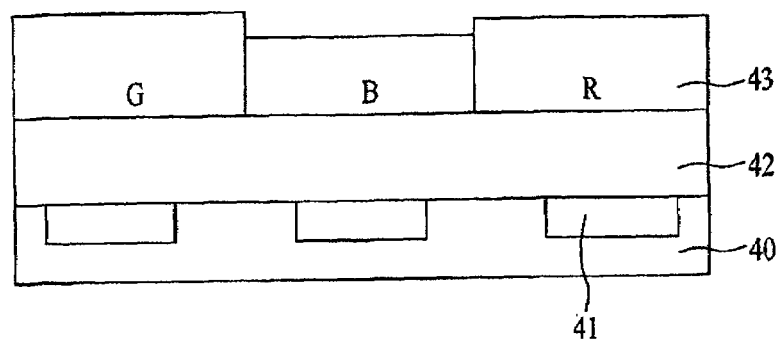
FIGS. 4A-4C are cross-sectional views illustrating a method for fabricating a CMOS image sensor according to an embodiment of the present invention.

An embodiment of the present invention will be described with reference to FIG. 4A-5C. As shown in FIG. 4A, a plurality of photodiodes 41, which may be in the form of a plurality of photo-gates, are formed at fixed intervals in a predetermined surface of a semiconductor substrate 40. Then, an insulating interlayer 42 of an oxide such as undoped silicate glass is formed on an entire surface of the semiconductor substrate 40 including the plurality of photodiodes 41. The insulating interlayer 42 may be formed as a multi-layered structure, including a light-shielding layer (not shown) for preventing light from reaching areas other than the photodiodes 41, and another insulating interlayer (not shown) formed on the light-shielding layer.

Subsequently, respective resist layers of green (G), blue (B), and red (R) are coated on the insulating interlayer 42, and then an exposure and development process is performed with respect to each layer of resist, thereby forming a color filter layer 43 including the green (G), blue (B), and red (R) color filter patterns. The color filter patterns are arranged to correspond to a plurality of active devices, such as photodiodes 41, for filtering light according to wavelength. The respective color filter patterns have different heights since each is formed by its own individual photolithography processing.

Figure 4B:
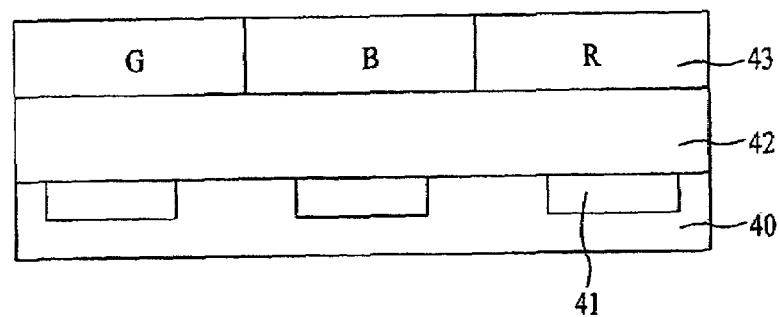

Referring to FIG. 4B, a chemical-mechanical polishing process or an etching process is performed with respect to the entire surface of the color filter layer 43 including each of the color filter patterns, thereby forming a planarized color filter layer 43. That is, the polishing process or the etching process serves to planarize the surface of the color filter layer 43. As a result, each color filter pattern is imparted with an equal height for receiving an array of microlenses.

Figure 4C:
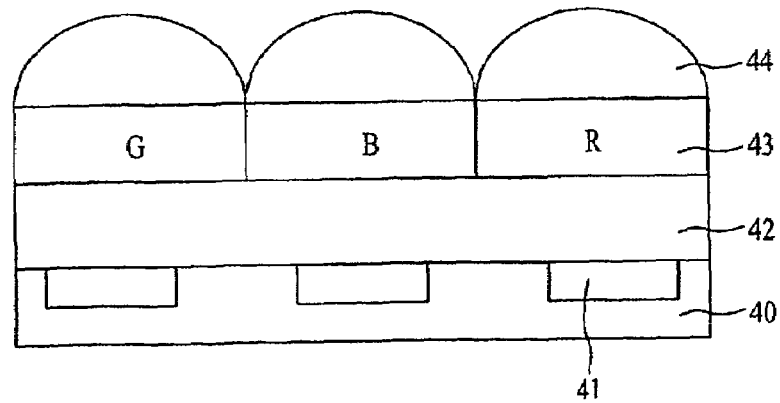

In FIG. 4C, a sacrificial layer (not shown) for microlens formation is coated on the planarized color filter layer 43, and an exposure and development process is performed with respect to the sacrificial layer, thereby forming a microlens pattern corresponding to an array of microlenses. The sacrificial layer may be formed as a resist layer or an oxide layer of tetra-ethyl-ortho-silicate. A plurality of microlenses 44 is formed by reflowing the microlens pattern. The reflowing process may employ a hot plate or a furnace. The curvature of the microlenses 44 can be varied to control focusing according to an application of a heat shrinkage method. Subsequently, the microlenses 44 are irradiated with ultraviolet light, thereby curing each microlens to maintain its optimal curvature radius.

Figure 5A:
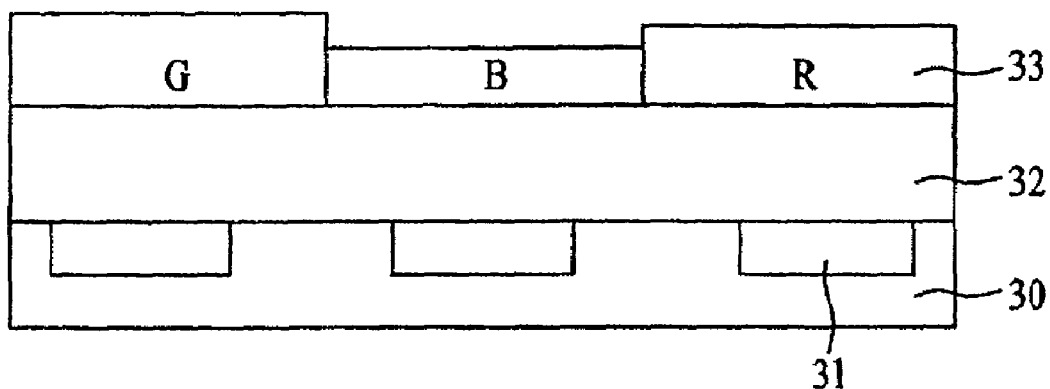
FIGS. 5A-5D are cross-sectional views illustrating a method for fabricating a CMOS image sensor according to another embodiment of the present invention.

Another embodiment of the present invention will be described with reference to FIG. 5A-5D. As shown in FIG. 5A, a plurality of photodiodes 31, which may be in the form of a plurality of photo-gates, are formed at fixed intervals in a predetermined surface of a semiconductor substrate 30. Then, an insulating interlayer 32 of an oxide such as undoped silicate glass is formed on an entire surface of the semiconductor substrate 30 including the plurality of photodiodes 31. The insulating interlayer 32 may be formed as a multi-layered structure, including a light-shielding layer (not shown) for preventing light from reaching areas other than the photodiodes 31, and another insulating interlayer (not shown) formed on the light-shielding layer.

Subsequently, respective resist layers of green (G), blue (B), and red (R) are coated on the insulating interlayer 32, and then an exposure and development process is performed with respect to each layer of resist, thereby forming a color filter layer 33 including the green (G), blue (B), and red (R) color filter patterns. The color filter patterns are arranged to correspond to a plurality of active devices, such as photodiodes 31, for filtering light according to wavelength. The respective color filter patterns have different heights since each is formed by its own individual photolithography processing.

Figure 5B:
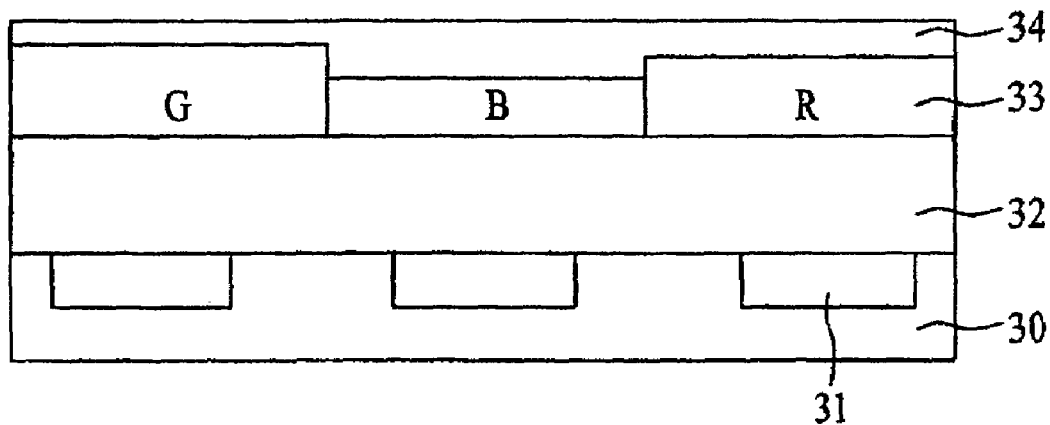

As shown in FIG. 5B, a planarization layer 34 is formed on the entire surface of the semiconductor substrate 30, including the color filter patterns, to fill any crevices in the color filter layer 33 that may be present in the underlying surface, for example, between the color filter patterns. The planarization layer 34 should cover the highest surface among the respective color filter patterns and will serve as a sacrificial layer.

Figure 5C:
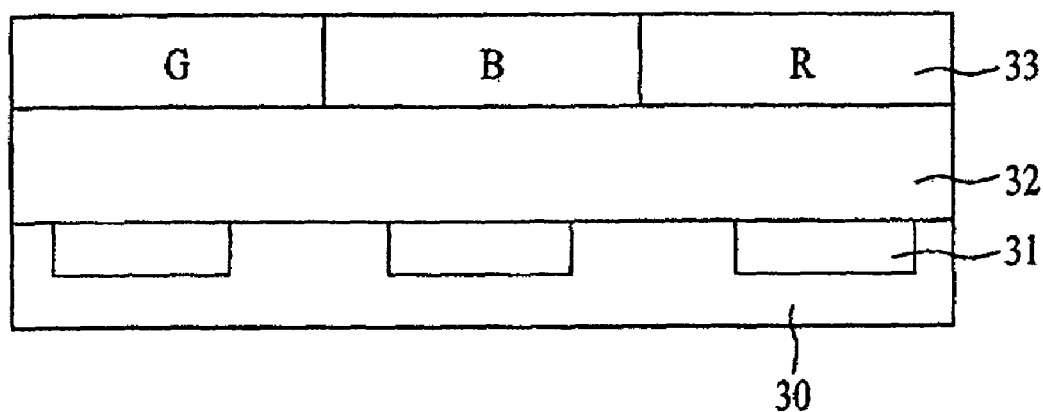

Referring to FIG. 5C, a chemical-mechanical polishing process or an etching process is performed with respect to the entire surface of the planarization layer 34. The planarization layer 34 and the respective color filter patterns of the color filter layer 33 are simultaneously polished or simultaneously etched. The planarization layer 34 enables less removal of one or more of the color filter patterns of the color filter layer 33. Thereby an excessive reduction in filter layer thickness, which may occur in striving for full planarization by polishing or etching the color filter layer directly, is avoided. That is, there may be remnants of the planarization layer 34 left after the polishing step or etching step, such that material of the planarization layer 34 is disposed between the color filter patterns of the color filter layer 33. Thus, with minor portions (not shown) of the planarization layer 34 remaining as necessary, each color filter pattern is imparted with an equal height for receiving an array of microlenses.

Figure 5D:
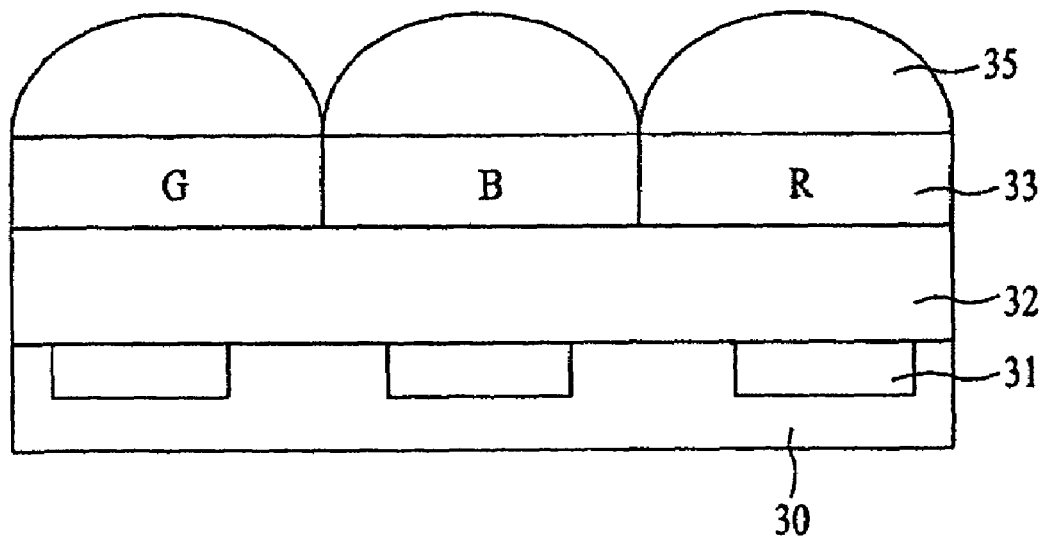

In FIG. 5D, a sacrificial layer for microlens formation is coated on the planarized color filter layer 33, and then an exposure and development process is performed with respect to the sacrificial layer, thereby forming a microlens pattern corresponding to an array of microlenses. The sacrificial layer may be formed as a resist layer or an oxide layer of tetra-ethyl-ortho-silicate. A plurality of microlenses 35 is formed by reflowing the microlens pattern. The reflowing process may employ a hot plate or a furnace. The curvature of the microlenses 35 can be varied to control focusing according to an application of a heat shrinkage method. Subsequently, the microlenses 35 are irradiated with ultraviolet light, thereby curing each microlens to maintain its optimal curvature radius.

Figure 6A:
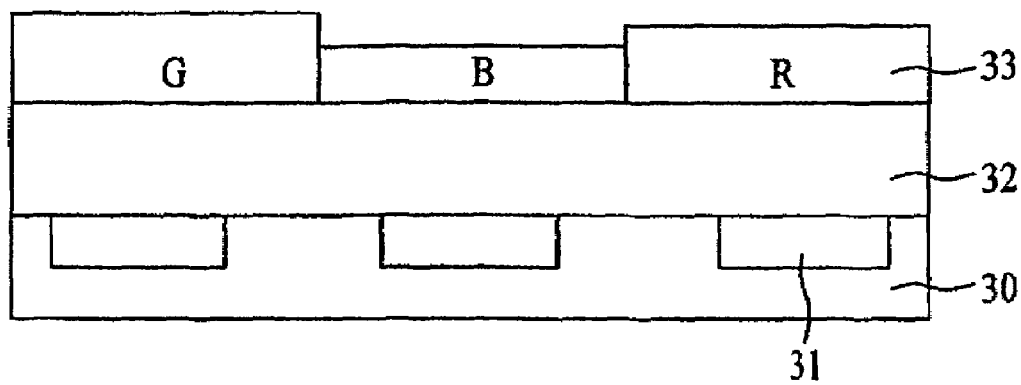
FIGS. 6A-6D are cross-sectional views illustrating a method for fabricating a CMOS image sensor according to another embodiment of the present invention

Another embodiment of the present invention will be described with reference to FIG. 6A-6D. As shown in FIG. 6A, a plurality of photodiodes 31, which may be in the form of a plurality of photo-gates, are formed at fixed intervals in a predetermined surface of a semiconductor substrate 30. Then, an insulating interlayer 32 of an oxide such as undoped silicate glass is formed on an entire surface of the semiconductor substrate 30 including the plurality of photodiodes 31. The insulating interlayer 32 may be formed as a multi-layered structure, including a light-shielding layer (not shown) for preventing light from reaching areas other than the photodiodes 31, and another insulating interlayer (not shown) formed on the light-shielding layer.

Subsequently, respective resist layers of green (G), blue (B), and red (R) are coated on the insulating interlayer 32, and then an exposure and development process is performed with respect to each layer of resist, thereby forming a color filter layer 33 including the green (G), blue (B), and red (R) color filter patterns. The color filter patterns are arranged to correspond to the plurality of active devices, such as photodiodes 31, for filtering light according to wavelength. The respective color filter patterns have different heights since each is formed by its own individual photolithography processing.

Figure 6B:
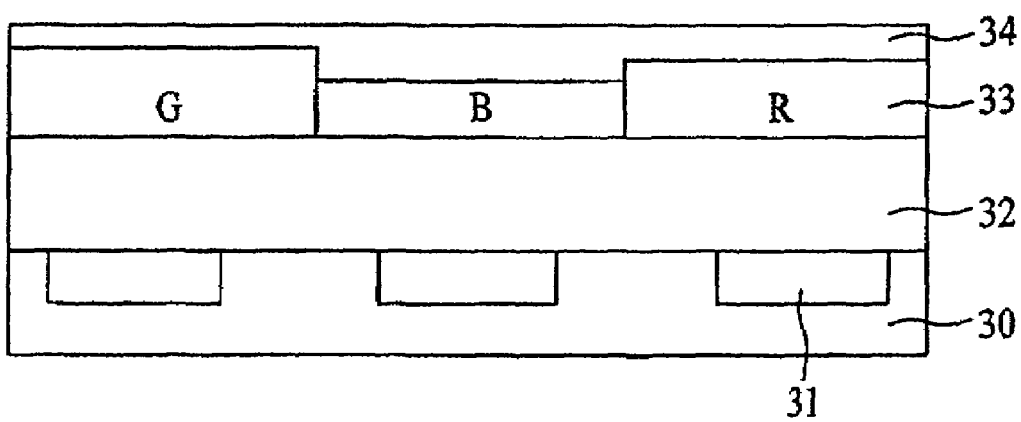

As shown in FIG. 6B, a planarization layer 34 is formed on the entire surface of the semiconductor substrate 30, including the color filter patterns, to fill any crevices in the color filter layer 33 that may be present in the underlying surface, for example, between the color filter patterns. The planarization layer 34 should cover the highest surface among the respective color filter patterns and will serve as a sacrificial layer.

Figure 6C:
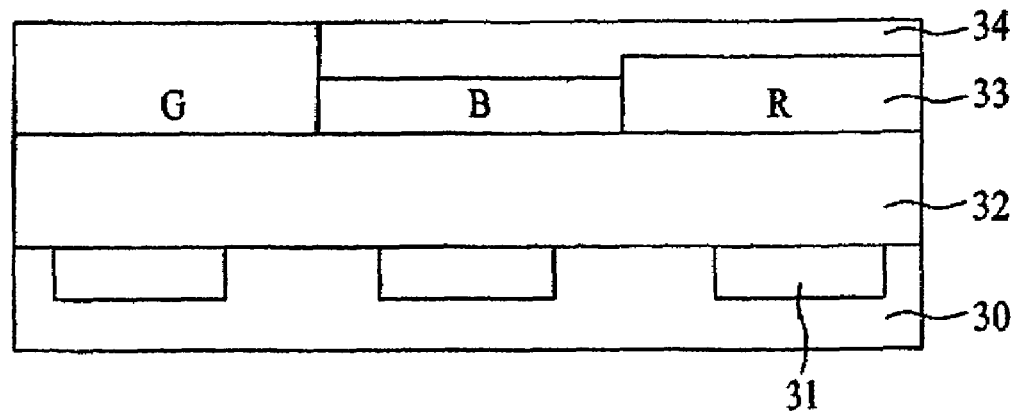

Referring to FIG. 6C, a chemical-mechanical polishing process or an etching process is performed to partially remove the planarization layer 34. The planarization layer 34 and one of the respective color filter patterns, such as the green color filter pattern, of the color filter layer 33 are simultaneously polished or simultaneously etched. The planarization layer 34 enables less removal of one or more of the color filter patterns of the color filter layer 33. Thereby an excessive reduction in filter layer thickness, which may occur in striving for full planarization by polishing or etching the color filter layer directly, is avoided. That is, there may be remnants of the planarization layer 34 left after the polishing step or etching step, such that material of the planarization layer 34 is disposed between the color filter patterns of the color filter layer 33. Thus, with minor portions (not shown) of the planarization layer 34 remaining as necessary, each color filter pattern is imparted with an equal height for receiving an array of microlenses.

Figure 6D:
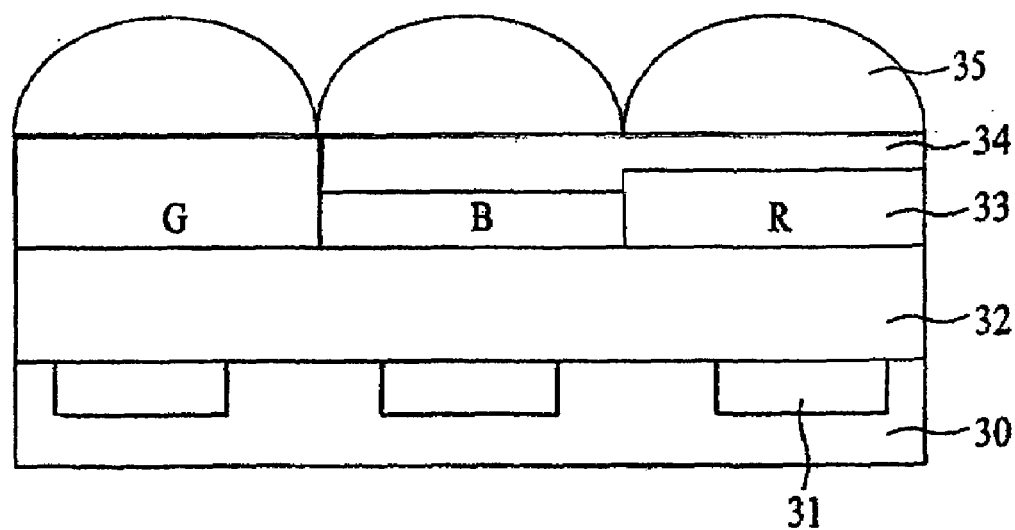

In FIG. 6D, a sacrificial layer for microlens formation is coated on the planarized color filter layer 33, and then an exposure and development process is performed with respect to the sacrificial layer, thereby forming a microlens pattern corresponding to an array of microlenses. The sacrificial layer may be formed as a resist layer or an oxide layer of tetra-ethyl-ortho-silicate. A plurality of microlenses 35 is formed by reflowing the microlens pattern. The reflowing process may employ a hot plate or a furnace. The curvature of the microlenses 35 can be varied to control focusing according to an application of a heat shrinkage method. Subsequently, the microlenses 35 are irradiated with ultraviolet light, thereby curing each microlens to maintain its optimal curvature radius.

By adopting the CMOS image sensor and method for fabricating the same according to the present invention, no planarization layer is needed between the color filter layer and the microlens since the color filter layer itself is imparted with a planarized upper surface. Accordingly, because the thickness of the planarization layer is eliminated, the traveling distance of light passing through the microlens to be incident on the photodiode can be decreased, thereby improving the image characteristics of the sensor.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A CMOS image sensor comprising:
   a semiconductor substrate;
   a plurality of active devices, provided in a predetermined surface of said semiconductor substrate, for generating electrical charges according to an amount of incident light;
   an insulating interlayer formed on an entire surface of said semiconductor substrate including said plurality of active devices;
   a color filter layer formed on said insulating interlayer, said color filter layer comprised of red, green, and blue color filter patterns for respectively filtering light according to wavelength, the color filter patterns arranged to correspond to said plurality of active devices; and
   a plurality of microlenses formed on said color filter layer, wherein the microlenses directly contact at least one of the color filter patterns and wherein said color filter layer is planarized so that each color filter pattern of said color filter layer is imparted with an equal height for receiving said plurality of microlenses.

2. The CMOS image sensor of claim 1, wherein the planarization of said color filter layer is performed by one of a chemical-mechanical polishing process and an etching process.

3. The CMOS image sensor of claim 2, wherein the planarization of said color filter layer is performed with respect to the entire surface of said color filter layer, including each of the filter patterns.

4. The CMOS image sensor of claim 1, further comprising:
   a sacrificial layer formed on the entire surface of said semiconductor substrate including said color filter layer.

5. The CMOS image sensor of claim 4, wherein said sacrificial layer is disposed between the color filter patterns of said color filter layer.

6. The CMOS image sensor of claim 5, wherein said sacrificial layer is partially removed from said color filter layer.

7. The CMOS image sensor of claim 5, wherein said sacrificial layer is completely removed from said color filter layer.

8. A method for fabricating a CMOS image sensor comprising:
   forming a plurality of photodiodes in a predetermined surface of a semiconductor substrate;
   forming an insulating interlayer on an entire surface of the semiconductor substrate including the plurality of photodiodes;
   forming a color filter layer including red, green, and blue color filter patterns on the insulating interlayer;
   planarizing the color filter layer so that each color filter pattern of the color filter layer is imparted with an equal height; and
   forming a plurality of microlenses on the planarized color filter layer, wherein the microlenses directly contact at least one of the color filter patterns.

9. The method of claim 8, wherein the planarization of the color filter layer is performed by one of a chemical-mechanical polishing process and an etching process.

10. The method of claim 9, wherein the planarization of the color filter layer is performed with respect to the entire surface of the color filter layer, including each of the color filter patterns.

11. The method of claim 8, further comprising:
    forming a sacrificial layer on the entire surface of the semiconductor substrate including said color filter layer.

12. The method of claim 11, wherein said sacrificial layer is formed to cover a highest surface among the color filter patterns of said color filter layer.

13. The method of claim 11, wherein said sacrificial layer and said color filter layer are simultaneously polished or simultaneously etched.

14. The method of claim 12, wherein said sacrificial layer is partially removed from said color filter layer.

15. The method of claim 12, wherein said sacrificial layer is completely removed from said color filter layer.

* * * * *